US009990972B1

United States Patent
Kwon et al.

(10) Patent No.: US 9,990,972 B1
(45) Date of Patent: Jun. 5, 2018

(54) TRACKING WORDLINE BEHAVIOR

(71) Applicant: ARM Limited, Cambridge (GB)

(72) Inventors: Jungtae Kwon, San Jose, CA (US);
Young Suk Kim, Fremont, CA (US)

(73) Assignee: ARM Limited, Cambridge (GB)

( * ) Notice: Subject to any disclaimer, the term of this patent is extended or adjusted under 35 U.S.C. 154(b) by 0 days. days.

(21) Appl. No.: 15/357,691

(22) Filed: Nov. 21, 2016

(51) Int. Cl.
*G11C 8/00* (2006.01)
*G11C 7/22* (2006.01)
*G11C 7/12* (2006.01)
*G11C 7/14* (2006.01)

(52) U.S. Cl.
CPC .............. *G11C 7/22* (2013.01); *G11C 7/12* (2013.01); *G11C 7/14* (2013.01)

(58) Field of Classification Search
CPC .... G11C 7/12; G11C 7/08; G11C 8/08; G11C 7/227; G11C 11/413–11/419
See application file for complete search history.

(56) References Cited

U.S. PATENT DOCUMENTS

| | | | | |
|---|---|---|---|---|
| 6,456,521 B1* | 9/2002 | Hsu | .................. | G11C 11/4094 |
| | | | | 365/149 |
| 6,545,935 B1* | 4/2003 | Hsu | .................. | G11C 11/405 |
| | | | | 365/189.07 |
| 8,315,085 B1* | 11/2012 | Chang | ..................... | 365/154 |
| 8,625,367 B2* | 1/2014 | Yun | .................... | G11C 5/025 |
| | | | | 365/185.18 |
| 2014/0010032 A1* | 1/2014 | Seshadri | .............. | G11C 7/12 |
| | | | | 365/203 |

* cited by examiner

*Primary Examiner* — Hien Nguyen
(74) *Attorney, Agent, or Firm* — Pramudji Law Group PLLC; Ari Pramudji

(57) ABSTRACT

Various implementations described herein are directed to an integrated circuit. The integrated circuit may include a memory bank having an array of memory cells that are accessible via a selected wordline and a pair of complementary bitlines. The integrated circuit may include a dummy wordline coupled to each of the pair of complementary bitlines via a pair of coupling capacitors. The dummy wordline may mimic the selected wordline. During transitions of the pair of complementary bitlines between first and second logic states, the dummy wordline may receive coupling capacitance from the pair of complementary bitlines via the pair of coupling capacitors.

20 Claims, 4 Drawing Sheets

TRACKING WORDLINE BEHAVIOR

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit design, tracking wordline behavior is important for a memory complier controlled by a self-timed internal clock. Some circuit designers have attempted to track the behaviour of a real wordline array by using a dummy array. The dummy array can be a part of a memory cell array, and the dummy array can be driven by a replica of a real wordline driver. However, using a dummy array can use additional area on chip for the dummy array. Thus, area overhead is increased with this approach, which reduces chip layout efficiency. In other cases, some circuit designers have attempted to track the behaviour of a real wordline array by using a metal wire and gate load with periphery logic devices. Unfortunately, area overhead is also increased, and the dummy array along with the metal wire and the gate loads of periphery logic devices may not accurately track the behaviour of the real wordline array. Thus, the resultant inaccurate tracking can cause functional problems during read and/or write operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for tracking wordline behavior in memory applications. For instance, various implementations described herein refer to a circuit scheme and/or technique to mimic the bitline to wordline coupling behavior in periphery logic circuitry. In some instances, the schemes and techniques described herein may track wordline behaviour in periphery circuitry with or without minimum area overhead. Further, in other instances, the schemes and techniques described herein may provide a way of tracking real wordline behavior without using a dummy array. As such, in these instances, coupling capacitance may be provided between a wordline WL and complementary bitlines BL/NBL. Further, this coupling capacitance may be provided during read and/or write operations, wherein coupling capacitance provided during a write operation may be more useful than coupling capacitance provided during a read operation. In some instances, a main component of coupling capacitance between the wordline WL and the complementary bitlines BL/NBL may include Miller capacitance, e.g., in a memory cell's pass transistor.

Accordingly, various implementations of tracking wordline behavior will now be described in detail herein with reference to FIGS. 1-4.

Figure 1:
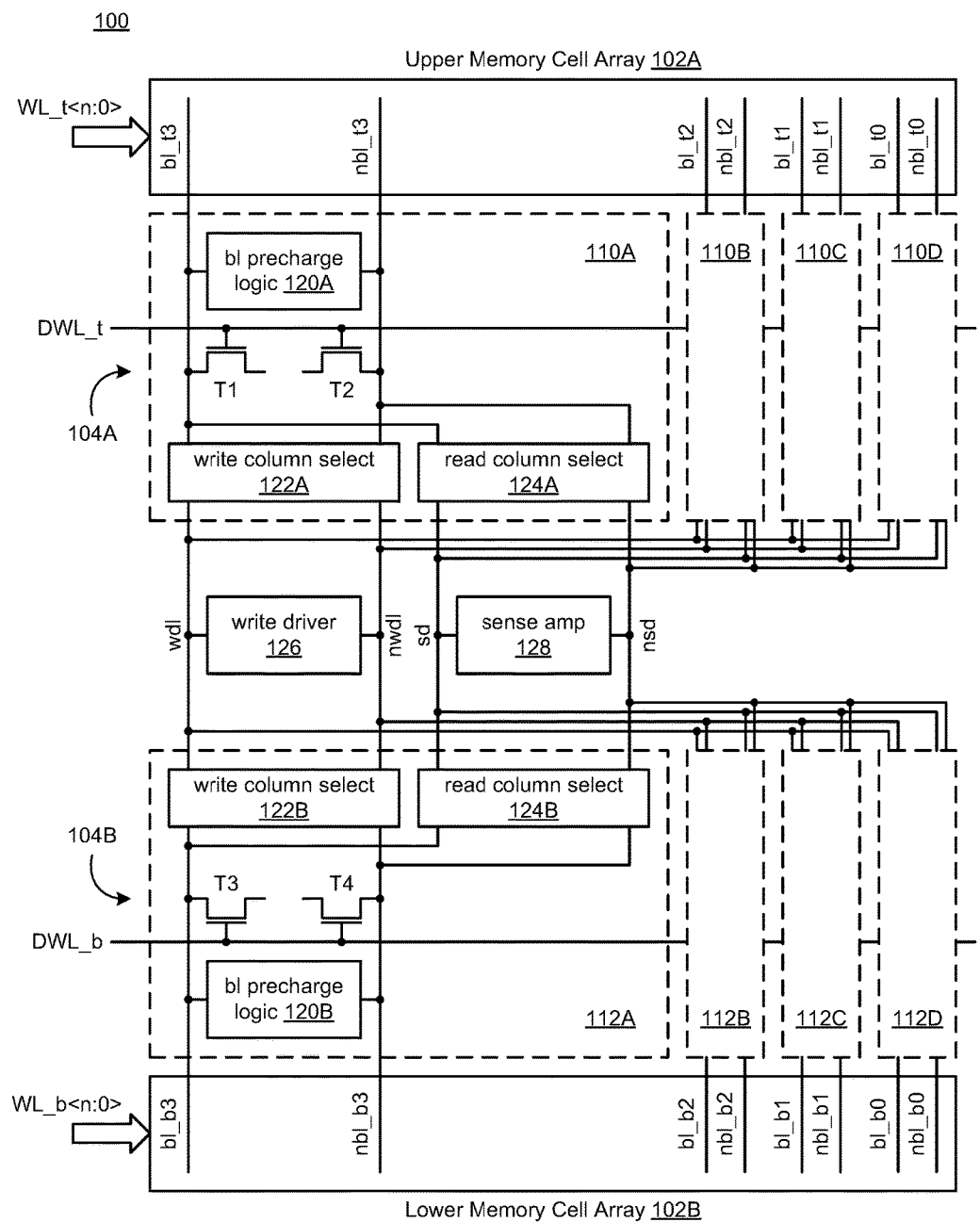
FIGS. 1-3 illustrate schematic diagrams of memory cell arrays having wordline behavior tracking circuitry in accordance with implementations described herein.

FIG. 1 illustrates a first schematic diagram of memory circuitry 100 having wordline behavior tracking circuitry 104A, 104B. The memory circuitry 100 may be implemented as an integrated circuit (IC) in utilizing various types of memory, such as, e.g., random access memory (RAM), and/or any other types of memory, including any type of volatile and non-volatile memory. The memory circuitry 100 may be implemented as an IC with dual rail memory architecture. The memory circuitry 100 may be integrated with various types of computing circuitry and/or various related components on a single chip. Alternatively, the memory circuitry 100 may be implemented in an embedded system for various electronic and mobile applications.

As shown in FIG. 1, the memory circuitry 100 may include one or more memory banks, including a first memory bank 102A and a second memory bank 102B. The first memory bank 102A may be referred to as an upper memory bank, and the second memory bank 102B may be referred to as a lower memory bank. Each of the first and second memory banks 102A, 102B may include an array of memory cells. In some implementations, each memory cell in the array may be referred to as a bitcell, and each memory cell may be configured to store at least one data bit value (e.g., a data value associated with logical '0' or '1'). The array of memory cells may include any number of memory cells or bitcells arranged in various configurations, such as, e.g., a two-dimensional (2D) memory array having columns and rows of multiple memory cells arranged in a 2D grid pattern with 2D indexing capabilities.

The first or upper memory bank 102A may include an array of memory cells arranged in columns and rows that are accessible via a first or upper selected wordline WL_t<n:0> and pairs of complementary bitlines bl_t<n:0> and nbl_t<n:0>, which include bl_t3 and nbl_t3, bl_t2 and nbl_t2, bl_t1 and nbl_t1, bl_t0 and nbl_t0. In general, the pair of complementary bitlines bl_t<n:0> and nbl_t<n:0> include a first bitline bl_t<n:0> and a second bitline nbl_t<n:0> that is a complement of the first bitline. As shown, the first or upper memory bank 102A may be accessible via upper periphery circuitry 110A, 110B, 110C, 110D corresponding to each of the pairs of complementary bitlines bl_t<n:0> and nbl_t<n:0>. For instance, a first upper periphery circuit 110A may correspond to a first pair of complementary bitlines bl_t3 and nbl_t3, a second upper periphery circuit 110B may correspond to a second pair of complementary bitlines bl_t2 and nbl_t2, a third upper periphery circuit 110C may correspond to a third pair of complementary bitlines bl_t1 and nbl_t1, and a fourth upper periphery circuit 110D may correspond to a fourth pair of complementary bitlines bl_t0 and nbl_t0. In this instance, the first memory bank 102A may include an array of memory cells that are accessible via the first selected wordline WL_t<n:0> and the pair of complementary bitlines bl_t3, nbl_t3.

As further shown in FIG. 1, each of the upper periphery circuits 110A, 110B, 110C, 110D may include a bitline (bl) precharge logic circuit 120A, a write column select circuit 122A, and a read column select circuit 124A. Each circuit 120A, 122A, 124A of each upper periphery circuit 110A, 110B, 110C, 110D are coupled to their corresponding pair of complementary bitlines bl_t<n:0> and nbl_t<n:0>. For instance, as shown, the first upper periphery circuit 110A may be coupled to its corresponding pair of complementary bitlines bl_t3 and nbl_t3. Further, each circuit 120A, 122A, 124A of each upper periphery circuit 110A, 110B, 110C, 110D may include a pair of coupling capacitors that may be coupled to their corresponding pair of complementary bitlines bl_t<n:0> and nbl_t<n:0>. For instance, as shown, the first upper periphery circuit 110A may include a pair of coupling capacitors 104A that may be coupled to its corresponding pair of complementary bitlines bl_t3 and nbl_t3.

The second or lower memory bank 102B may include another array of memory cells arranged in columns and rows that are accessible via a second or lower selected wordline WL_b<n:0> and pairs of complementary bitlines bl_b<n:0> and nbl_b<n:0>, which include bl_b3 and nbl_b3 and bl_b2 and nbl_b2, bl_b1 and nbl_b1, bl_b0 and nbl_b0. As shown, the second or lower memory bank 102B may be accessible via lower periphery circuitry 112A, 112B, 112C, 112D corresponding to each pair of complementary bitlines bl_b<n:0> and nbl_b<n:0>. For instance, a first lower periphery circuit 112A may correspond to a first pair of complementary bitlines bl_b3 and nbl_b3, a second lower periphery circuit 112B may correspond to a second pair of complementary bitlines bl_b2 and nbl_b2, a third lower periphery circuit 112C may correspond to a third pair of complementary bitlines bl_b1 and nbl_b1, and a fourth lower periphery circuit 112D may correspond to a fourth pair of complementary bitlines bl_b0 and nbl_b0. In this instance, the second memory bank 102B may include an array of memory cells that are accessible via the second selected wordline WL_b<n:0> and the pair of complementary bitlines bl_b3, nbl_b3.

As further shown in FIG. 1, each of the lower periphery circuits 112A, 112B, 112C, 112D may include a bitline (bl) precharge logic circuit 120B, a write column select circuit 122B, and a read column select circuit 124B. Each circuit 120B, 122B, 124B of each lower periphery circuit 112A, 112B, 112C, 112D are coupled to their corresponding pair of complementary bitlines bl_b<n:0> and nbl_b<n:0>. For instance, the first lower periphery circuit 112A may be coupled to its corresponding pair of complementary bitlines bl_b3 and nbl_tb3. Further, each circuit 120B, 122B, 124B of each lower periphery circuit 112A, 112B, 112C, 112D may include a pair of coupling capacitors that may be coupled to their corresponding pair of complementary bitlines bl_b<n:0> and nbl_b<n:0>. For instance, the first lower periphery circuit 112A may include another pair of coupling capacitors 104B that may be coupled to its corresponding pair of complementary bitlines bl_b3 and nbl_b3.

The memory circuitry 100 may include a dummy wordline DWL_t and DWL_b coupled to each of the upper periphery circuits 110A, 110B, 110C, 110D and each of the lower periphery circuits 112A, 112B, 112C, 112D. For instance, in reference to the first upper periphery circuit 110A, the dummy wordline DWL_t may be coupled to each of the pair of complementary bitlines bl_t3 and nbl_t3 via a (first) pair of coupling capacitors 104A. In another instance, in reference to the first lower periphery circuit 112A, the dummy wordline DWL_b may be coupled to each of the pair of complementary bitlines bl_b3 and nbl_b3 via another (second) pair of coupling capacitors 104B.

As further shown in FIG. 1, in reference to the first upper peripheral circuit 110A, the pair of coupling capacitors 104A may include a first coupling capacitor T1 that is coupled between the dummy wordline DWL_t and a first bitline bl_t3 of the pair of complementary bitlines. Further, the pair of coupling capacitors 104A may include a second coupling capacitor T2 that is coupled between the dummy wordline DWL_t and a second bitline nbl_t3 of the pair of complementary bitlines. In some implementations, the pair of coupling capacitors 104A may include various types of transistors that are configured to provide coupling capacitance. For instance, the first coupling capacitor T1 may be embodied as a first transistor, and the second coupling capacitor T2 may be embodied as a second transistor. Some transistors that may be used include metal-oxide-semiconductor (MOS) transistors, e.g., N-type and/or P-type MOS transistors.

As further shown in FIG. 1, in reference to the first lower peripheral circuit 112A, the pair of coupling capacitors 104B may include a third coupling capacitor T3 that is coupled between the dummy wordline DWL_b and a first bitline bl_b3 of the pair of complementary bitlines. Further, the pair of coupling capacitors 104B may include a fourth coupling capacitor T4 that is coupled between the dummy wordline DWL_b and a second bitline nbl_b3 of the pair of complementary bitlines. In some implementations, the pair of coupling capacitors 104B may include various types of transistors that are configured to provide coupling capacitance. For instance, the third coupling capacitor T3 may be embodied as a third transistor, and the fourth coupling capacitor T4 may be embodied as a fourth transistor. Some transistors that may be used include metal-oxide-semiconductor (MOS) transistors, e.g., N-type and/or P-type MOS transistors.

In some implementations, the dummy wordline DWL_t and DWL_b may mimic the selected wordlines WL_t<n:0> and WL_b<n:0>. In various scenarios, the dummy wordline DWL_t and DWL_b may mimic the selected wordlines WL_t<n:0> and WL_b<n:0> during read and write operations. In some instances, the coupling capacitance may include or may be referred to as Miller capacitance.

Further, during transitions of the pair of complementary bitlines bl_t3, nbl_t3 and bl_b3, nbl_b3 between first and second logic states (e.g., logic 0 and 1), the dummy wordline DWL_t may receive coupling capacitance from the pair of complementary bitlines bl_t3, nbl_t3, and the dummy wordline DWL_b may receive coupling capacitance from the pair of complementary bitlines bl_b3, nbl_b3 via the pair of coupling capacitors 104A, 104B, respectively. Thus, in various scenarios, the dummy wordline DWL_t may receive coupling capacitance from each of the pair of complementary bitlines bl_t3, nbl_t3, and the dummy wordline DWL_b may receive coupling capacitance from each of the pair of complementary bitlines bl_b3, nbl_b3 via the first and second coupling capacitors 104A, 104B, respectively, during transitions of the pair of complementary bitlines bl_t3, nbl_t3 and bl_b3, nbl_b3 between the first and second logic states (e.g., logic 0 and 1). For instance, transitions of the pair of complementary bitlines bl_t3, nbl_t3 and bl_b3, nbl_b3 between the first and second logic states (e.g., logic 0 and 1) may include logic state transitions between a logic zero state to a logic one state (e.g., rising from logic 0 to logic 1). In another instance, transitions of the pair of complementary bitlines bl_t3, nbl_t3 and bl_b3, nbl_b3 between the first and second logic states (e.g., logic 0 and 1) may include logic state transitions between a logic one state to a logic zero state (e.g., falling from logic 1 to logic 0).

The memory circuitry 100 may include a write driver 126 and a sense amplifier 128 coupled to each of the upper periphery circuits 110A, 110B, 110C, 110D and each of the lower periphery circuits 112A, 112B, 112C, 112D. In reference to the first upper periphery circuit 110A, the write driver 126 may be coupled to each of the pair of complementary bitlines bl_t3 and nbl_t3 via the write column select circuit 122A, and the sense amplifier 128 may be coupled to each of the pair of complementary bitlines bl_t3 and nbl_t3 via the write column select circuit 122A. In reference to the first lower periphery circuit 112A, the write driver 126 may be coupled to each of the pair of complementary bitlines bl_b3 and nbl_b3 via the write column select circuit 122B, and the sense amplifier 128 may be coupled to each of the pair of complementary bitlines bl_b3 and nbl_b3 via the read column select circuit 124B.

The write driver 126 may provide complementary write data signals (wdl, nwdl) to each of the upper and lower periphery circuits 110A-110D and 112A-112D via the complementary bitlines bl_t<n:0>, nbl_t<n:0> and bl_b<n:0> and nbl_b<n:0>. For instance, the write driver 126 may provide write data signals (wdl, nwdl) to the first upper periphery circuit 110A via the complementary bitlines bl_t3, nbl_t3, and the write driver 126 may provide complementary write data signals (wdl, nwdl) to the first lower periphery circuit 112A via the complementary bitlines bl_b3, nbl_b3. Further, the sense amplifier 128 may receive complementary sensing signals (sd, nsd) from each of the upper and lower periphery circuits 110A-110D and 112A-112D via the complementary bitlines bl_t<n:0>, nbl_t<n:0> and bl_b<n:0> and nbl_b<n:0>. The sense amplifier 128 may receive complementary sensing signals (sd, nsd) from the first upper periphery circuit 110A via the complementary bitlines bl_t3, nbl_t3, and the sense amplifier 128 may receive complementary sensing signals (sd, nsd) from the first lower periphery circuit 112A via the complementary bitlines bl_b3, nbl_b3.

In accordance with various implementations described herein, FIG. 1 shows a method of mimicking coupling capacitance in the periphery by adding periphery devices, such as, e.g., one or more NMOS transistors, between the dummy wordline DWL and the pair of complementary bitlines (bl/nbl). In some scenarios, as described herein, whenever the bitlines (bl/nbl) transition from one state to another state (e.g., between logic 0 and 1), the dummy wordline DWL may receive a coupling capacitance effect from the bitlines (bl/nbl), in a manner similar to the coupling effect in the real wordline WL. Thus, FIG. 1 shows a technique for tracking wordline behavior that uses some area overhead, although minor.

Figure 2:
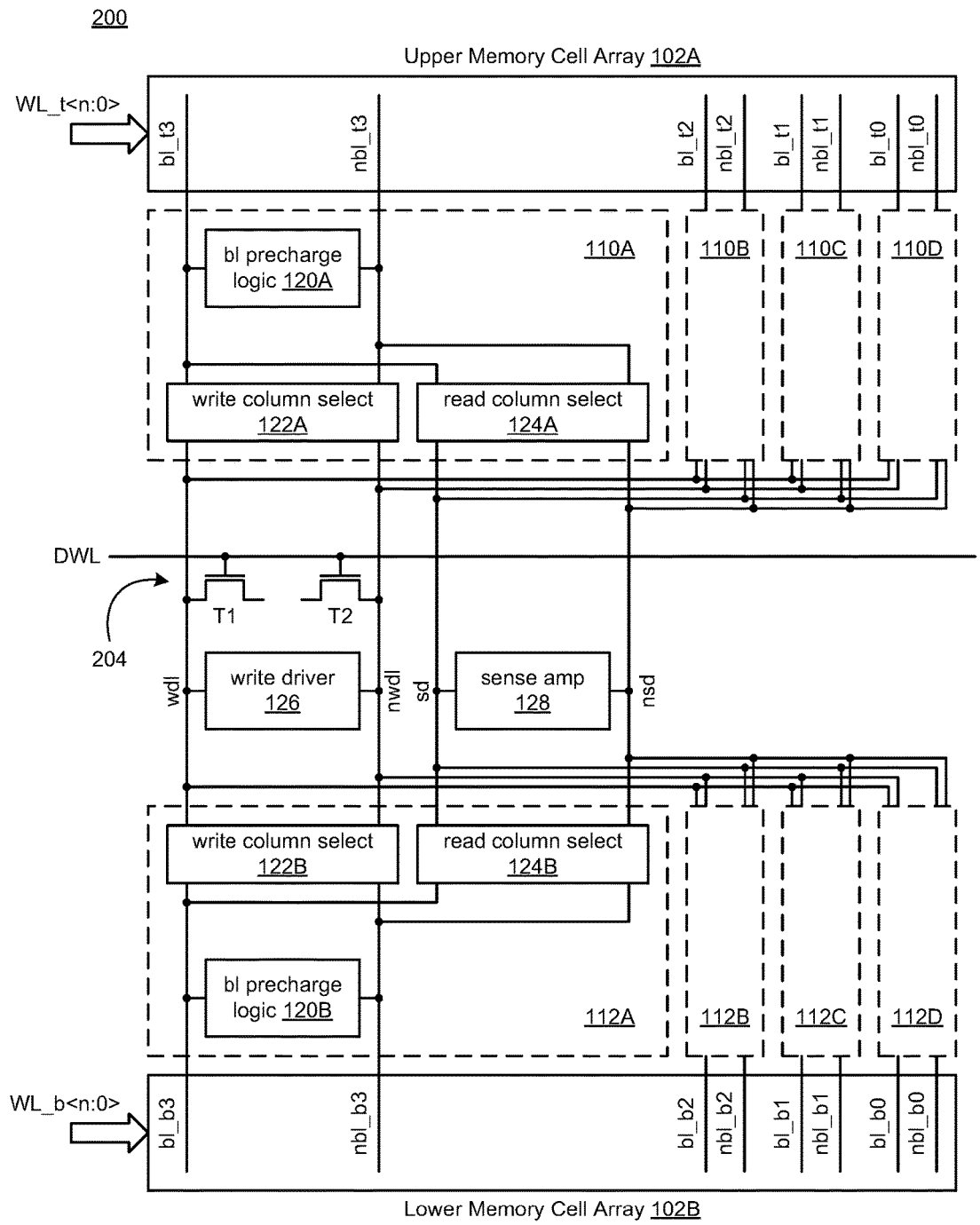

FIG. 2 illustrates a second schematic diagram of memory circuitry 200 having wordline behavior tracking circuitry 204. Similar components of memory circuitry 200 in FIG. 2 have similar functionality as the memory circuitry 100 in FIG. 1.

As shown in FIG. 2, the memory circuitry 200 may include the first and second memory banks 102A, 102B, with each having an array of memory cells that are accessible via the selected wordlines WL_t<n:0> and WL_b<n:0> and the pairs of complementary bitlines bl_t<n:0>, nbl_t<n:0> and bl_b<n:0> and nbl_b<n:0>, respectively. The write driver 126 may be coupled to the pair of complementary bitlines bl_t<n:0>, nbl_t<n:0> and bl_b<n:0> and nbl_b<n:0>. The dummy wordline DWL may be coupled to the pair of complementary bitlines bl_t<n:0>, nbl_t<n:0> and bl_b<n:0>, nbl_b<n:0> via a first pair of coupling capacitors 204, such as, e.g., first and second coupling capacitors T1, T2.

In some cases, the dummy wordline DWL may mimic one or more of the selected wordlines WL_t<n:0> and WL_b<n:0>. During a write operation, the dummy wordline DWL may receive coupling capacitance from the write driver 126 via one or more of the pair of complementary bitlines bl_t<n:0>, nbl_t<n:0> and bl_b<n:0> and nbl_b<n:0> and the first pair of coupling capacitors 204.

In other cases, the dummy wordline DWL may receive coupling capacitance from the write driver 126 and one or more of the pair of complementary bitlines bl_t<n:0>, nbl_t<n:0> and bl_b<n:0> and nbl_b<n:0> via the first and second coupling capacitors T1, T2 during a write operation. The dummy wordline DWL may mimic one or more of the selected wordlines WL_t<n:0> and WL_b<n:0> during write operations, and the coupling capacitance may include Miller capacitance.

In accordance with various implementations described herein, FIG. 2 shows a method for implementing the coupling capacitance effect with less logic and less area overhead. For instance, as shown in the scheme and technique of FIG. 2, the dummy wordline DWL may receive the coupling capacitance from the write driver output during a write operation and not receive coupling capacitance during a read operation. Advantageously, this approach is somewhat simple to implement with less area overhead. This approach provides benefit by tracking the coupling capacitance in a write operation, where bitlines (bl/nbl) to real WL coupling is stronger than in a read operation. Hence, FIG. 2 shows another technique for tracking wordline behavior that uses less area overhead.

Figure 3:
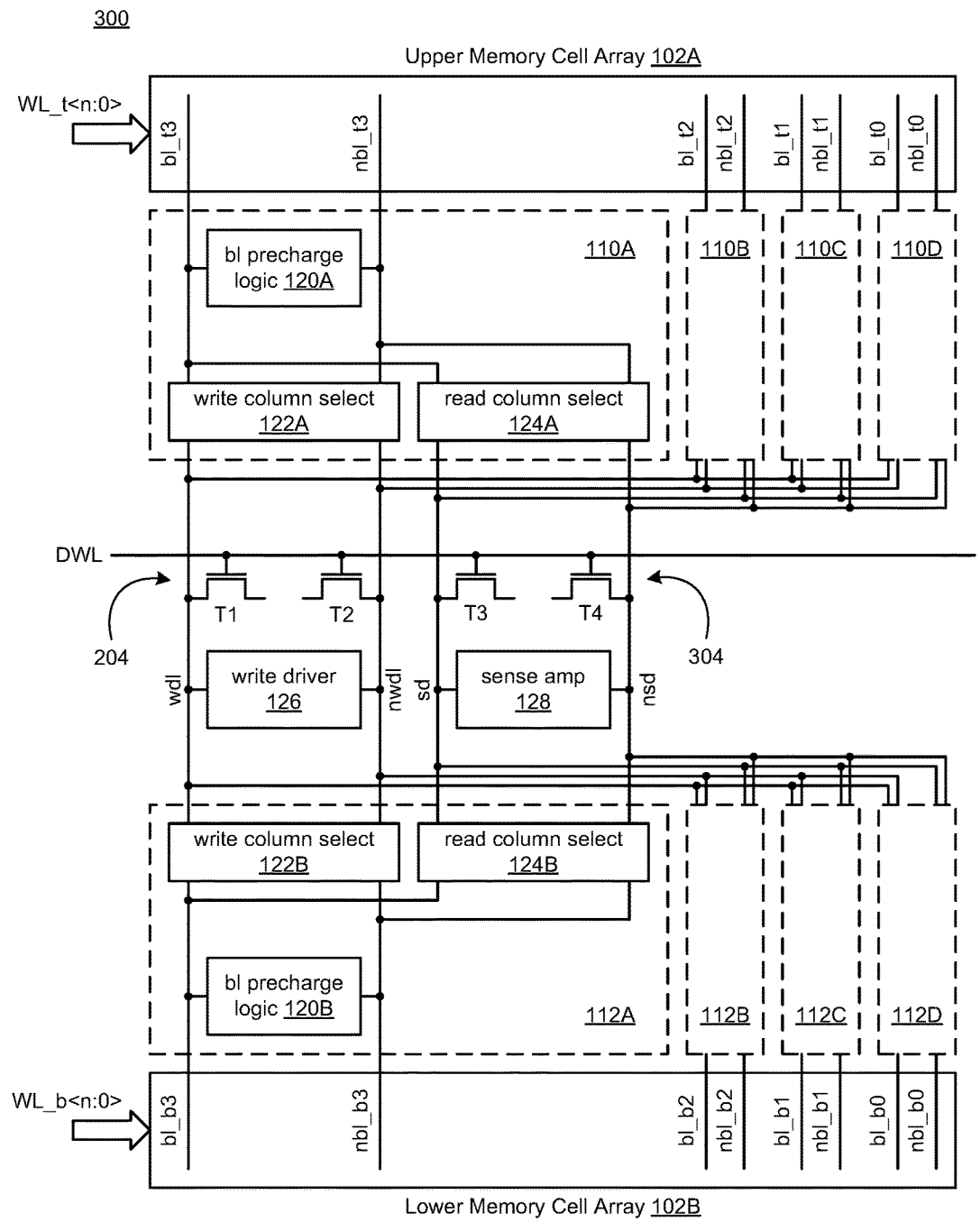

FIG. 3 illustrates a third schematic diagram of memory circuitry 300 having wordline behavior tracking circuitry 304. Similar components of memory circuitry 300 in FIG. 3 have similar functionality as the memory circuitry 100 in FIG. 1 and the memory circuitry 200 in FIG. 2.

The sense amplifier 128 may be coupled to the pair of complementary bitlines bl_t<n:0>, nbl_t<n:0> and bl_b<n:0> and nbl_b<n:0>. The dummy wordline DWL may be coupled to the pair of complementary bitlines bl_t<n:0>, nbl_t<n:0> and bl_b<n:0> and nbl_b<n:0> via a second pair of coupling capacitors 304, such as e.g., third and fourth coupling capacitors T3, T4.

In some cases, the dummy wordline DWL may mimic one or more of the selected wordlines WL_t<n:0> and WL_b<n:0>. Further, during a read operation, the dummy wordline DWL may receive coupling capacitance from the sense amplifier 128 via one or more of the pair of complementary bitlines bl_t<n:0>, nbl_t<n:0> and bl_b<n:0> and nbl_b<n:0> and the second pair of coupling capacitors 304.

In other cases, the dummy wordline DWL may receive coupling capacitance from the sense amplifier 128 and one or more of the pair of complementary bitlines bl_t<n:0>, nbl_t<n:0> and bl_b<n:0> and nbl_b<n:0> via the third and fourth coupling capacitors T3, T4 during a read operation. The dummy wordline DWL may mimic one or more of the selected wordlines WL_t<n:0> and WL_b<n:0> during read operations, and the coupling capacitance may include Miller capacitance.

In accordance with various implementations described herein, FIG. 3 shows a method where the dummy wordline DWL may receive the coupling capacitance effect during both read and write operations. For instance, if the coupling capacitances of the dummy wordline DWL are placed at both nodes for the write driver output and the sense amplifier input, then the dummy wordline DWL may receive coupling capacitance effect during both read and write operations. In some scenarios, this approach may provide for similar accuracy with the method of FIG. 1 but may utilize less area overhead, and this approach may be somewhat easy to implement. In some implementations, this approach may be an improved way of generating the DWL's coupling capacitance. Thus, FIG. 3 shows an accurate approach with improved accuracy and less overhead.

Figure 4:
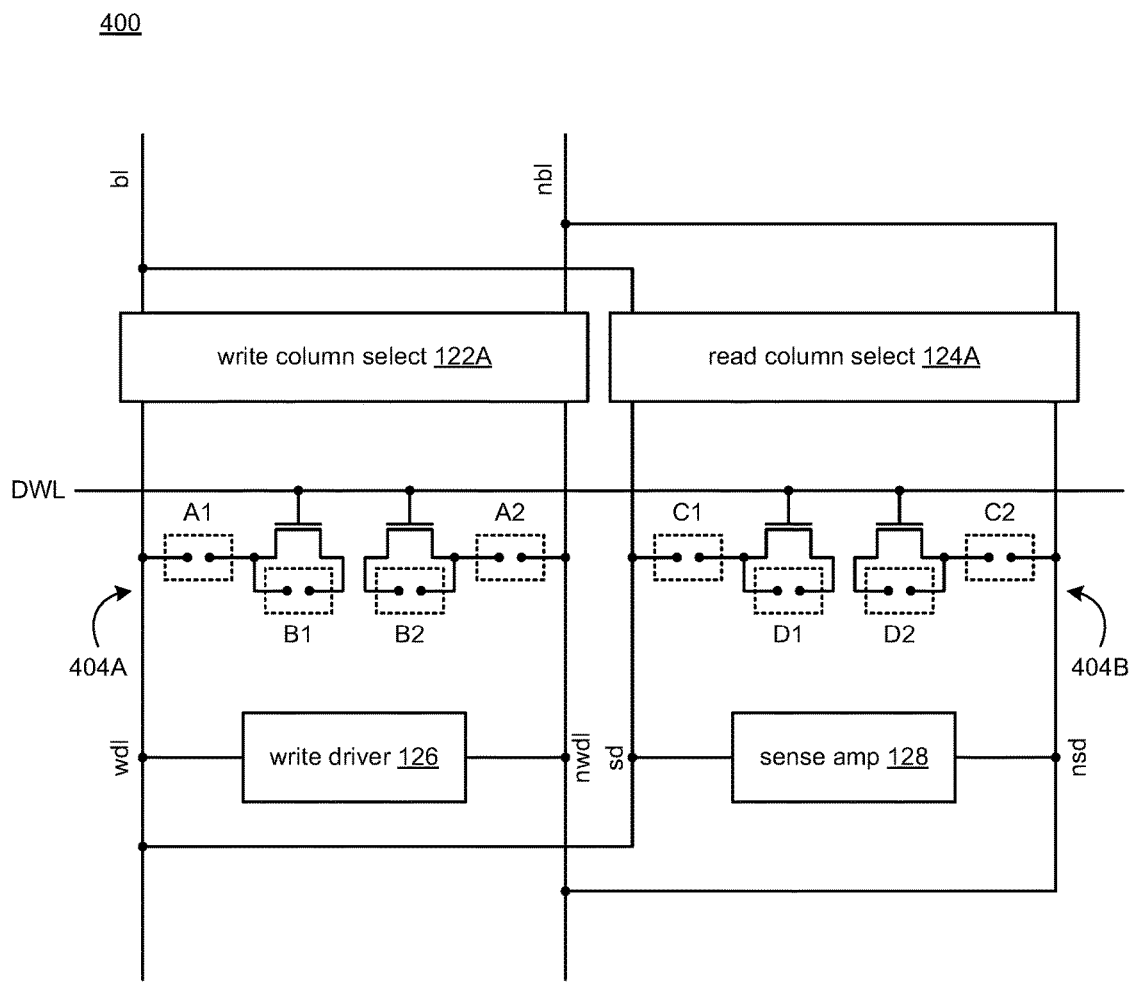
FIG. 4 illustrates a schematic diagram of a memory cell array having wordline behavior tracking circuitry that utilizes various programmable logic devices in accordance with implementations described herein.

FIG. 4 illustrates a fourth schematic diagram of a portion of memory circuitry 400 having wordline behavior tracking circuitry that utilizes various programmable logic devices 404A, 404B. It should be understood that similar components of the portion of the memory circuitry 400 in FIG. 4 may have similar functionality as the memory circuitry 100, 200, and 300 in FIGS. 1, 2, and 3, respectively.

As shown in FIG. 4, the dummy wordline DWL may be coupled to each of the pair of complementary bitlines (bl, nbl). As described herein, the dummy wordline DWL may mimic one or more of the selected wordlines WL_t<n:0>, WL_b<n:0>.

The write driver 126 may be coupled to each of the pair of complementary bitlines (bl, nbl). The write driver 126 may be further coupled to the dummy wordline DWL via a first pair of programmable logic devices 404A. During a write operation, the dummy wordline DWL may receive coupling capacitance from the write driver 126 via the pair of complementary bitlines (bl, nbl) and the first pair of programmable logic devices 404A.

The first pair of programmable logic devices 404A may include first and second programmable logic devices A1, A2 that are coupled between the dummy wordline DWL and the pair of complementary bitlines (bl, nbl). The first and second programmable logic devices A1, A2 may be programmed by providing a short between the open terminals of the devices A1, A2. For instance, if the terminals are shorted, the dummy wordline DWL may receive coupling capacitance from the write driver 126 and the pair of complementary bitlines (bl, nbl) via the first and second programmable logic devices A1, A2 during a write operation. In various implementations, programming option A (with shorted A1, A2) may provide for controlling usage of DWL coupling during a write operation in each bit.

Further, the first pair of programmable logic devices 404A may include third and fourth programmable logic devices B1, B2 that are coupled between the dummy wordline DWL and the pair of complementary bitlines (bl, nbl). The third and fourth programmable logic devices B1, B2 may be programmed by providing a short between the open terminals of the devices B1, B2. For instance, if the terminals are shorted, the dummy wordline DWL may receive additional coupling capacitance from the write driver 126 and the pair of complementary bitlines (bl, nbl) via the third and fourth programmable logic devices B1, B2 during the write operation. In various implementations, programming option B (with shorted B1, B2) may provide for controlling usage of a coupling ratio of the DWL coupling during a write operation in each bit. Therefore, the DWL coupling ratio may be increased with programming option B during a write operation.

The sense amplifier 128 may be coupled to the pair of complementary bitlines (bl, nbl). The sense amplifier 128 may be further coupled to the dummy wordline DWL via a second pair of programmable logic devices 404B. During a read operation, the dummy wordline DWL may receive coupling capacitance from the sense amplifier 128 via the pair of complementary bitlines (bl, nbl) and the second pair of programmable logic devices 404B.

The second pair of programmable logic devices 404B may include fifth and sixth programmable logic devices C1, C2 that are coupled between the dummy wordline DWL and the pair of complementary bitlines (bl, nbl). The fifth and sixth programmable logic devices C1, C2 may be programmed by providing a short between open terminals of the devices C1, C2. For instance, if the terminals are shorted, the dummy wordline DWL may receive coupling capacitance from the sense amplifier 128 and the pair of complementary bitlines (bl, nbl) via the fifth and sixth programmable logic devices C1, C2 during a read operation. In some instances, programming option C (with shorted C1, C2) may provide for controlling usage of DWL coupling during a read operation in each bit.

Further, the second pair of programmable logic devices 404B may include seventh and eighth programmable logic devices D1, D2 that are coupled between the dummy wordline DWL and the pair of complementary bitlines (bl, nbl). The seventh and eighth programmable logic devices D1, D2 may be programmed by providing a short between the open terminals of the devices D1, D2. For instance, if the terminals are shorted, the dummy wordline DWL may receive additional coupling capacitance from the sense amplifier 128 and the pair of complementary bitlines (bl, nbl) via the seventh and eighth programmable logic devices D1, D2 during the read operation. In some instances, programming option D (with shorted D1, D2) may provide for controlling usage of another coupling ratio of DWL coupling during a read operation in each bit. The DWL coupling ratio may be increased with programming option D during a read operation.

In accordance with various implementations described herein, FIG. 4 shows a method for providing programmable dummy WL coupling capacitance. In some cases, the dummy WL's total coupling capacitance may be controlled by various programming options A, B, C, and D. Thus, various examples of controlling the dummy WL's coupling capacitance is shown in FIG. 4, with reference to implementation of FIG. 3. In these programming scenarios, the dummy WL's coupling capacitance may be determined by one or more of the programming options A, B, C, and D.

For instance, programming option A may provide for controlling usage of the dummy WL coupling capacitance during a write operation in each bit. If programming option A is used for coupling or shorting A1, A2, then the dummy WL coupling capacitance may be added during a write operation. In another instance, programming option B may provide for controlling usage of a coupling ratio of the dummy WL coupling capacitance during a write operation in each bit. If programming option B is used for coupling or shorting B1, B2, then the coupling ratio may be increased during a write operation. In another instance, programming option C may provide for controlling usage of the dummy WL coupling capacitance during a read operation in each bit. If programming option C is used for coupling or shorting C1, C2, then the dummy WL coupling capacitance may be added during a read operation. In another instance, programming option D may provide for controlling usage of a coupling ratio of the dummy WL coupling capacitance during a read operation in each bit. If programming option D is used for coupling or shorting D1, D2, then the coupling ratio may be increased during a read operation.

In some scenarios, based on PVT (Process-Voltage-Temperature) corners and memory instance's size, the dummy WL's coupling effects in read and/or write operations may be improved and/or optimized by various combinations of one or more or all of the above described programming options A, B, C, and D. Accordingly, any combination of the options A, B, C, and D may be used to provide DWL coupling capacitance.

Described herein are various implementations of an integrated circuit. The integrated circuit may include a memory bank having an array of memory cells that are accessible via a selected wordline and a pair of complementary bitlines. The integrated circuit may include a dummy wordline coupled to each of the pair of complementary bitlines via a pair of coupling capacitors. The dummy wordline may mimic the selected wordline. During transitions of the pair of complementary bitlines between first and second logic states, the dummy wordline may receive coupling capacitance from the pair of complementary bitlines via the pair of coupling capacitors.

Described herein are various implementations of an integrated circuit. The integrated circuit may include a memory bank having an array of memory cells that are accessible via a selected wordline and a pair of complementary bitlines. The integrated circuit may include a write driver coupled to the pair of complementary bitlines. The integrated circuit may include a dummy wordline coupled to the pair of complementary bitlines via a first pair of coupling capacitors. The dummy wordline may mimic the selected wordline. During a write operation, the dummy wordline may receive coupling capacitance from the write driver via the pair of complementary bitlines and the first pair of coupling capacitors.

Described herein are various implementations of an integrated circuit. The integrated circuit may include a memory bank having an array of memory cells that are accessible via a selected wordline and a pair of complementary bitlines. The integrated circuit may include a dummy wordline coupled to each of the pair of complementary bitlines. The dummy wordline may mimic the selected wordline. The integrated circuit may include a write driver coupled to the pair of complementary bitlines. The write driver may be further coupled to the dummy wordline via a first pair of programmable logic devices. During a write operation, the dummy wordline may receive coupling capacitance from the write driver via the pair of complementary bitlines and the first pair of programmable logic devices. The integrated circuit may include a sense amplifier coupled to the pair of complementary bitlines. The sense amplifier may be further coupled to the dummy wordline via a second pair of programmable logic devices. During a read operation, the dummy wordline may receive coupling capacitance from the sense amplifier via the pair of complementary bitlines and the second pair of programmable logic devices.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory bank having an array of memory cells that are accessible via a selected wordline and a pair of complementary bitlines; and
   a dummy wordline coupled to each of the pair of complementary bitlines via a pair of coupling capacitors,
   wherein the dummy wordline mimics the selected wordline, and wherein, during transitions of the pair of complementary bitlines between first and second logic states, the dummy wordline receives coupling capacitance from the pair of complementary bitlines via the pair of coupling capacitors.

2. The integrated circuit of claim 1, wherein the pair of complementary bitlines include a first bitline and a second bitline that is a complement of the first bitline.

3. The integrated circuit of claim 1, wherein the pair of coupling capacitors includes a first coupling capacitor that is coupled between the dummy wordline and a first bitline of the pair of complementary bitlines, and wherein the pair of coupling capacitors includes a second coupling capacitor that is coupled between the dummy wordline and a second bitline of the pair of complementary bitlines.

4. The integrated circuit of claim 3, wherein the dummy wordline receives coupling capacitance from the pair of complementary bitlines via the first and second coupling capacitors during transitions of the pair of complementary bitlines between the first and second logic states.

5. The integrated circuit of claim 1, wherein the dummy wordline mimics the selected wordline during read and write operations, and wherein the coupling capacitance includes Miller capacitance.

6. The integrated circuit of claim 1, wherein the transitions of the pair of complementary bitlines between first and second logic states include logic state transitions between a logic zero state to a logic one state.

7. The integrated circuit of claim 1, wherein the transitions of the pair of complementary bitlines between first and second logic states include logic state transitions between a logic one state to a logic zero state.

8. An integrated circuit, comprising:
a memory bank having an array of memory cells that are accessible via a selected wordline and a pair of complementary bitlines;
a write driver coupled to the pair of complementary bitlines; and
a dummy wordline coupled to the pair of complementary bitlines via a first pair of coupling capacitors,
wherein the dummy wordline mimics the selected wordline, and wherein, during a write operation, the dummy wordline receives coupling capacitance from the write driver via the pair of complementary bitlines and the first pair of coupling capacitors.

9. The integrated circuit of claim 8, wherein the pair of complementary bitlines include a first bitline and a second bitline that is a complement of the first bitline.

10. The integrated circuit of claim 8, wherein the first pair of coupling capacitors includes a first coupling capacitor that is coupled between the dummy wordline and a first bitline of the pair of complementary bitlines, and wherein the first pair of coupling capacitors includes a second coupling capacitor that is coupled between the dummy wordline and a second bitline of the pair of complementary bitlines.

11. The integrated circuit of claim 10, wherein the dummy wordline receives coupling capacitance from the write driver and the pair of complementary bitlines via the first and second coupling capacitors during a write operation.

12. The integrated circuit of claim 8, wherein the dummy wordline mimics the selected wordline during read and write operations, and wherein the coupling capacitance includes Miller capacitance.

13. The integrated circuit of claim 8, further comprising:
a sense amplifier coupled to the pair of complementary bitlines,
wherein the dummy wordline is coupled to the pair of complementary bitlines via a second pair of coupling capacitors, and
wherein, during a read operation, the dummy wordline receives coupling capacitance from the sense amplifier via the pair of complementary bitlines and the second pair of coupling capacitors.

14. The integrated circuit of claim 13, wherein the second pair of coupling capacitors includes a third coupling capacitor that is coupled between the dummy wordline and a first bitline of the pair of complementary bitlines, and wherein the second pair of coupling capacitors includes a fourth coupling capacitor that is coupled between the dummy wordline and a second bitline of the pair of complementary bitlines.

15. The integrated circuit of claim 14, wherein the dummy wordline receives coupling capacitance from the sense amplifier and the pair of complementary bitlines via the third and fourth coupling capacitors during a read operation.

16. An integrated circuit, comprising:
a memory bank having an array of memory cells that are accessible via a selected wordline and a pair of complementary bitlines;
a dummy wordline coupled to each of the pair of complementary bitlines, wherein the dummy wordline mimics the selected wordline;
a write driver coupled to the pair of complementary bitlines, the write driver further coupled to the dummy wordline via a first pair of programmable logic devices, wherein during a write operation, the dummy wordline receives coupling capacitance from the write driver via the pair of complementary bitlines and the first pair of programmable logic devices; and
a sense amplifier coupled to the pair of complementary bitlines, the sense amplifier further coupled to the dummy wordline via a second pair of programmable logic devices, wherein during a read operation, the dummy wordline receives coupling capacitance from the sense amplifier via the pair of complementary bitlines and the second pair of programmable logic devices.

17. The integrated circuit of claim 16, wherein the first pair of programmable logic devices includes first and second programmable logic devices that are coupled between the dummy wordline and the pair of complementary bitlines, and wherein the dummy wordline receives coupling capacitance from the write driver and the pair of complementary bitlines via the first and second programmable logic devices during a write operation.

18. The integrated circuit of claim 17, wherein the first pair of programmable logic devices includes third and fourth programmable logic devices that are coupled between the dummy wordline and the pair of complementary bitlines, and wherein the dummy wordline receives additional coupling capacitance from the write driver and the pair of complementary bitlines via the third and fourth programmable logic devices during the write operation.

19. The integrated circuit of claim 16, wherein the second pair of programmable logic devices includes fifth and sixth programmable logic devices that are coupled between the dummy wordline and the pair of complementary bitlines, and wherein the dummy wordline receives coupling capacitance from the sense amplifier and the pair of complementary bitlines via the fifth and sixth programmable logic devices during a read operation.

20. The integrated circuit of claim 19, wherein the second pair of programmable logic devices includes seventh and eighth programmable logic devices that are coupled between the dummy wordline and the pair of complementary bitlines, and wherein the dummy wordline receives additional coupling capacitance from the sense amplifier and the pair of complementary bitlines via the seventh and eighth programmable logic devices during the read operation.

\* \* \* \* \*